(12) United States Patent
Oh et al.

(10) Patent No.: US 7,745,871 B2
(45) Date of Patent: Jun. 29, 2010

(54) FIN FIELD EFFECT TRANSISTORS INCLUDING OXIDATION BARRIER LAYERS

(76) Inventors: Chang-Woo Oh, 20311o,
Yeonglong-dong 1032 16 Yeongtong-gu,
Suwon-si, Gyeonggi-do (KR);
Dong-Gun Park, 102-903, Yangji-mael
Geumho I danji Apt., Sunae-dong,
Bundang-gu, Seongnam-si, Gyeonggi-do
(KR); Dong-Won Kim, 506-1602,
Jeongdeon Maeul Apt., 192,
Jeongja-dong, Bundang-gu,
Seongnam-si, Gyeonggi-do (KR);
Yong-Kyu Lee, 935-205
Gajoksaenghwal-dong, Seoul National
University, Bongeheon Dong,
Gwanak-gu, Seoul (KR)

( * ) Notice: Subject to any disclaimer, the term of this patent is extended or adjusted under 35 U.S.C. 154(b) by 5 days.

(21) Appl. No.: 11/871,453

(22) Filed: Oct. 12, 2007

(65) Prior Publication Data
US 2008/0029828 A1    Feb. 7, 2008

Related U.S. Application Data

(62) Division of application No. 11/020,899, filed on Dec. 23, 2004, now Pat. No. 7,297,600.

(30) Foreign Application Priority Data
Jun. 4, 2004    (KR) ...................... 10-2004-0040986

(51) Int. Cl.
*H01L 29/78*    (2006.01)

(52) U.S. Cl. ............... 257/314; 257/365; 257/E21.421; 257/E29.264; 438/283

(58) Field of Classification Search ................. 257/329, 257/E21.421, E21.623, 314, 365, 401, E29.264; 438/157, 284, 253
See application file for complete search history.

(56) References Cited

U.S. PATENT DOCUMENTS
6,432,829 B2    8/2002    Muller et al.
(Continued)

FOREIGN PATENT DOCUMENTS
KR    1020030065631    8/2003

OTHER PUBLICATIONS
U.S. Appl. No. 10/936,033, filed Sep. 8, 2004.
Notice to File a Response/Amendment to the Examination Report corresponding to Korean Patent Application No. 10-2004-0040986 mailed Dec. 19, 2005.

*Primary Examiner*—Matthew C Landau
*Assistant Examiner*—Lindsay Wickers
(74) *Attorney, Agent, or Firm*—Myers Bigel Sibley & Sajovec, P.A.

(57) ABSTRACT

A method of forming a fin field effect transistor on a semiconductor substrate includes forming a fin-shaped active region vertically protruding from the substrate. An oxide layer is formed on a top surface and opposing sidewalls of the fin-shaped active region. An oxidation barrier layer is formed on the opposing sidewalls of the fin-shaped active region and is planarized to a height no greater than about a height of the oxide layer to form a fin structure. The fin structure is oxidized to form a capping oxide layer on the top surface of the fin-shaped active region and to form at least one curved sidewall portion proximate the top surface of the fin-shaped active region. The oxidation barrier layer has a height sufficient to reduce oxidation on the sidewalls of the fin-shaped active region about halfway between the top surface and a base of the fin-shaped active region. Related devices are also discussed.

8 Claims, 20 Drawing Sheets

U.S. PATENT DOCUMENTS

| | | | |
|---|---|---|---|
| 6,458,662 B1 | 10/2002 | Yu ............................... | 438/286 |
| 6,583,469 B1 | 6/2003 | Fried et al. ................... | 257/329 |
| 6,611,029 B1 | 8/2003 | Ahmed et al. ................ | 257/365 |
| 6,768,158 B2 | 7/2004 | Lee et al. ..................... | 257/315 |
| 7,071,048 B2 | 7/2006 | Son et al. | |
| 7,154,779 B2 * | 12/2006 | Mokhlesi et al. ........ | 365/185.01 |
| 2004/0217433 A1 * | 11/2004 | Yeo et al. ..................... | 257/412 |
| 2004/0262676 A1 * | 12/2004 | Lee et al. ..................... | 257/328 |
| 2005/0145926 A1 * | 7/2005 | Lee ............................ | 257/316 |

* cited by examiner

FIN FIELD EFFECT TRANSISTORS INCLUDING OXIDATION BARRIER LAYERS

CLAIM OF PRIORITY

This application is a divisional of and claims priority from U.S. application Ser. No. 11/020,899, filed Dec. 23, 2004 now U.S. Pat. No. 7,297,600, which claims priority from Korean Patent Application No. 2004-40986, filed on Jun. 4, 2004, the contents of which are hereby incorporated herein by reference in their entireties.

FIELD OF THE INVENTION

The present invention relates to semiconductor devices, and more specifically, to methods for forming field effect transistors (FETs) and related devices.

BACKGROUND OF THE INVENTION

Over the past 30 years, developments in silicon-based integrated circuit technology, such as metal-oxide-semiconductor (MOS) devices including field effect transistors (FETs and/or MOSFETs), have provided greater device speed, increased integration density, and improved device functionality with reduced cost. Referring to FIG. 1A, MOS devices are typically formed in a substrate 10 having heavily-doped source/drain (S/D) regions 12 separated by a more lightly-doped channel region 18. The channel region 18 may be controlled by a gate electrode 14 that is separated from the channel region by a gate dielectric 16.

However, with increasing requirements for higher integration as well as higher performance, lower power dissipation, and greater economic efficiency, a variety of problems associated with degradation of transistor characteristics may arise. For example, as the channel length of a transistor is reduced, short-channel effects such as punch-through, drain induced barrier lowering (DIBL), sub-threshold swing, increased parasitic capacitance between a junction region and the substrate (i.e. junction capacitance), and increased leakage current may occur.

A variety of transistor designs have been developed which may address some of the problems faced by conventional bulk-MOS semiconductor devices. For example, FIG. 1B illustrates a conventional ultra-thin body transistor. In an ultra-thin body transistor, the channel region 18 may be formed in a thin layer above an insulating region. Also, FIG. 1C illustrates a conventional double-gate transistor. In a double gate transistor, a single channel region 18 may be controlled by two gates 14a and 14b that are separated from the channel region by gate dielectrics 16a and 16b. As such, both sides of the channel region may be controlled.

However, the devices of FIGS. 1B and 1C may require more complex fabrication techniques, which may increase cost and decrease yield. Accordingly, such devices may be less practical in general semiconductor manufacturing.

For example, ultra-thin body transistors may be considerably more expensive to produce than conventional bulk-MOS devices. Although they may provide improved performance in some areas, ultra-thin body transistors may be susceptible to floating body and heat transfer effects, and may have current limitations imposed by the body thickness.

In addition, by controlling the channel from two sides, double-gate devices may exhibit improved leakage performance. However, double-gate devices may require a more complex fabrication processes, which may increase expense and lower yield. More particularly, it may be difficult to align upper gate 14a and lower gate 14b (as shown in FIG. 1C) in double-gate transistor fabrication.

FinFET transistors, in which the channel region is formed in a vertically protruding "fin" of semiconductor material, may provide leakage performance similar to or better than that of double-gate transistors, but may be less complicated and less expensive to produce. FinFET transistors (or simply FinFETs) may also support scaling to sub-50 nm channel lengths (and perhaps as low as 10 nm), which may provide additional improvements in integration density and operational speed.

In FinFETs, the channel region may be formed in a vertically oriented fin-shaped active region protruding from the semiconductor substrate, as discussed above. The gate dielectrics may be formed on the fin, and the gate electrode may be formed around the fin. The channel region may be formed first, followed by source and drain regions. The source/drain regions may be taller than the fin. Dielectric and conductive materials may then be used to form double- and/or triple-gate devices.

FIGS. 2A to 2D are cross-sectional views of a semiconductor substrate illustrating conventional methods for forming a FinFET.

Referring now to FIG. 2A, an etch mask pattern 13 is formed on a silicon substrate 10. A portion of the silicon substrate 10 exposed by the etch mask pattern 13 is anisotropically etched to form a silicon fin 15. An upper edge of the silicon fin 15 is formed at a sharp angle (i.e. at nearly a right angle) due to the anisotropic etching. The etch mask pattern 13 may be formed of nitride, and a thermal oxide layer may be formed between the nitride and substrate. In order to provide electrical insulation between neighboring silicon fins, a device isolation layer 17 is formed, as shown in FIG. 2B.

Referring now to FIG. 2C, a portion of the device isolation layer 17 is removed, exposing lateral surfaces, or sidewalls, of the silicon fin 15. The lateral surfaces of the silicon fin 15 may serve as a channel region for a transistor.

Referring to FIG. 2D, a gate insulating layer 19 is formed on the exposed sidewalls of the silicon fin 15, and a gate electrode 21 is formed to create a double-gate FinFET. Both sidewalls of the silicon fin 15 may be controlled by the gate electrode 21.

According to conventional methods for forming double-gate FinFETs, adhesion between the etch mask pattern 13 and the substrate 10 may be weakened when a portion of the device isolation layer 17 is removed. Since the device isolation layer 17 may also be formed of an oxide, a thermal oxide layer of the etch mask pattern 13 on a portion of silicon fin may be removed along with the portion of the device isolation layer 17. As the width of the silicon fin 15 may be decreased to allow for higher device integration, it may be increasingly possible for the etch mask pattern 13 to be separated from the upper surface of the silicon fin 15. If the etch mask pattern is removed, an upper surface of the silicon fin 15 may be controlled by the gate electrode 21, and a triple-gate FinFET may be formed. Accordingly, double-gate and triple-gate FinFETs may be formed on the same wafer.

Still referring to FIG. 2D, in order to form higher-performance devices, the width of the silicon fin 15 may be decreased by performing a thermal oxidation process before forming the gate insulating layer 19. In other words, the width of the silicon fin 15 may be reduced by forming a sacrificial oxide layer at sidewalls of the fin 15 using a thermal oxidation process, and then removing the sacrificial oxide layer. As such, the fin 15 may have a width narrower than that of the etch mask pattern 13. Accordingly, an under-cut region may be formed under the etch mask pattern 13, resulting in poor step coverage during subsequent processes, such as the deposition of gate electrode material. In addition, if the sacrificial oxide layer is removed, the thermal oxide layer of the etch mask pattern 13 may also be partially removed. As a result, the etch mask pattern 13 may be separated from the silicon fin 15, and the problems described above may occur.

Triple-gate FinFETs have been developed which may address some of these problems. In triple-gate FinFETs, an upper surface and both sidewalls of the silicon fin are controlled by a gate electrode, which may improve current driving capacity.

A conventional method for forming a triple-gate FinFET will be described with reference to FIGS. 3A to 3B. Triple-gate FinFETs can be formed by removing the etch mask pattern in the conventional methods for forming double-gate FinFETs described above with reference to FIGS. 2A to 2D.

As shown in FIG. 2B, a silicon fin 15 and a device isolation layer 17 are formed. Then, as shown in FIG. 3A, a portion of the device isolation layer 17 and an etch mask pattern 13 are removed. As a result, both sidewalls and an upper surface of the silicon fin 15 are exposed.

Referring to FIG. 3B, a gate insulating layer 19 is formed on the exposed surfaces (i.e. both sidewalls and the upper surface) of the silicon fin 15, and then a gate electrode 21 is formed.

However, a "hump" in subthreshold current may occur during operation of such a triple-gate FinFET. In other words, if an upper edge or corner of the silicon fin is sharp, and if a gate electrode controls both the sidewalls and the upper surface of the silicon fin, an electric field may be concentrated at the sharp edge portion (i.e., at the corner where both sidewalls and the upper surface of the silicon fin meet). As such, leakage current may be present at voltages below the transistor threshold voltage.

SUMMARY OF THE INVENTION

According to some embodiments of the present invention, a method for forming a fin field effect transistor on a semiconductor substrate may include forming a fin-shaped active region vertically protruding from the substrate. An oxide layer may be formed on a top surface and opposing sidewalls of the fin-shaped active region. An oxidation barrier layer may be formed on the opposing sidewalls of the fin-shaped active region and planarized to a height no greater than about a height of the oxide layer to form a fin structure. The fin structure may be oxidized to form a capping oxide layer on the top surface of the fin-shaped active region and to form at least one curved sidewall portion proximate the top surface of the fin-shaped active region.

In some embodiments, planarizing an oxidation barrier layer may include planarizing the oxidation barrier layer to a height about a height of the fin-shaped active region.

In other embodiments, oxidizing the fin structure may further include oxidizing the fin structure to form a second curved sidewall portion spaced apart from the at least one curved sidewall portion proximate a base of the fin-shaped active region.

In still other embodiments, oxidizing the fin structure to form the second curved sidewall portion may include oxidizing the fin structure for an increased duration as compared to oxidizing the fin structure to form the at least one curved sidewall portion.

In further embodiments, planarizing an oxidation barrier layer may include forming an oxidation barrier layer on the top surface and sidewalls of the fin-shaped active region and on the substrate. The oxidation barrier layer may be anisotropically etched to expose the top surface of the fin and the substrate and to form a junction between the oxidation barrier layer and the substrate at the base of the fin-shaped active region. The oxidation of the fin structure to form a second curved sidewall portion may be facilitated by the junction between the oxidation barrier layer and the substrate.

In still further embodiments, planarizing an oxidation barrier layer may include forming a device isolation layer on the substrate adjacent the base of the fin. An oxidation barrier layer may be formed on the top surface and sidewalls of the fin-shaped active region and on the device isolation layer. The oxidation barrier layer may be anisotropically etched to expose the top surface of the fin and the device isolation layer to form a junction between the oxidation barrier layer and the device isolation layer at a base of the oxidation barrier layer. The oxidation of the fin structure to form a second curved sidewall portion may be facilitated by the junction between the oxidation barrier layer and the device isolation layer.

In some embodiments, the method for forming a fin field effect transistor may include removing the oxidation barrier layer. The gate electrode may be formed on the sidewalls of the fin-shaped active region to form a double-gate fin field effect transistor.

In other embodiments, the method for forming a fin field effect transistor may include removing the capping oxide layer before forming the gate electrode. The gate electrode may be formed on the top surface and sidewalls of the fin shaped active region to form a triple gate fin field effect transistor.

In still other embodiments, prior to forming the gate electrode, a tunneling insulating layer may be formed on the sidewalls of the fin-shaped active region. A charge storage layer may be formed on the tunneling insulating layer, and a blocking insulating layer may be formed on the charge storage layer.

In further embodiments, forming a fin-shaped active region may include forming a mask pattern on a first portion of the substrate. A second portion of the substrate exposed by the mask pattern may be etched to form the fin-shaped active region, and the mask pattern may be removed. The capping oxide layer may have a higher dielectric strength than the mask pattern.

In still further embodiments, the oxidation barrier layer may be a charge storage layer including silicon nitride, polysilicon, amorphous silicon, nano-crystal, and/or quantum dot materials.

According to some embodiments of the present invention, a semiconductor device may include a fin-shaped active region vertically protruding from a semiconductor substrate. The fin-shaped active region may have at least one curved sidewall portion proximate an upper surface of the fin-shaped active region. The device may further include an oxidation barrier layer adjacent opposing sidewalls of the fin-shaped active region. The oxidation barrier layer may have a height sufficient to reduce oxidation on the sidewalls of the fin-shaped active region about halfway between the upper surface and a base of the fin-shaped active region. The semiconductor device may also include a capping oxide layer on the upper surface of the fin-shaped active region.

In some embodiments, the oxidation barrier layer may have a curved upper portion proximate the upper surface of the fin-shaped active region sufficient to facilitate oxidation at the upper surface of the fin-shaped active region.

In other embodiments, the fin-shaped active region may have a second curved sidewall portion spaced apart from the at least one curved sidewall portion proximate the base of the fin-shaped active region.

In still other embodiments, the semiconductor device may include a device isolation layer on the substrate adjacent the base of the fin-shaped active region. A junction between the device isolation layer and a lower portion of the oxidation barrier layer may be sufficient to facilitate oxidation proximate the base of the fin-shaped active region.

In further embodiments, the semiconductor device may include an oxide layer on the substrate and on sidewalls of the fin-shaped active region between the oxidation barrier layer and the sidewalls of the fin-shaped active region. A junction between the oxide layer and a lower portion of the oxidation barrier layer may be sufficient to facilitate oxidation proximate the base of the fin-shaped active region.

In still further embodiments, the semiconductor device may include a tunneling insulating layer on the sidewalls of the fin-shaped active region, and a blocking insulating layer on the oxidation barrier layer. The oxidation barrier layer may be a charge storage layer comprising silicon nitride, polysilicon, amorphous silicon, nano-crystal, and/or quantum dot materials.

In other embodiments, the capping oxide layer may have a dielectric constant lower than a nitride mask pattern.

According to some embodiments of the present invention, a semiconductor device may include a Ω-shaped fin vertically protruding from a semiconductor substrate. The fin may have a narrower width at a base of the fin as compared to upper portions of the fin. The semiconductor device may further include an oxidation barrier layer adjacent opposing sidewalls of the fin. The oxidation barrier layer may have a height sufficient to reduce oxidation on the sidewalls of the fin about halfway between a top surface and the base of the fin. The semiconductor device may also include a capping oxide layer on the top surface of the fin.

BRIEF DESCRIPTION OF THE DRAWINGS

FIGS. 20A to 23A are overhead views illustrating methods for forming a fin according to some embodiments of the present invention.

FIGS. 20B to 23B and 20C to 23C are cross-sectional views taken along line I-I and II-II of FIG. 19A, respectively.

DETAILED DESCRIPTION OF EMBODIMENTS OF THE INVENTION

Figure 1A:
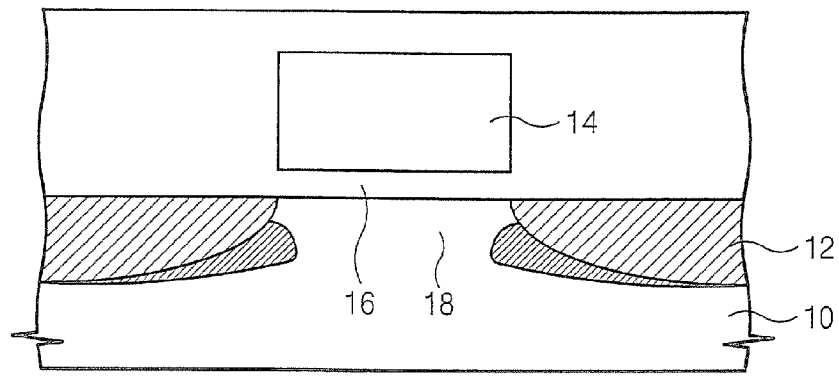
FIG. 1A is a cross-sectional view illustrating a conventional planar FET.
Figure 1B:
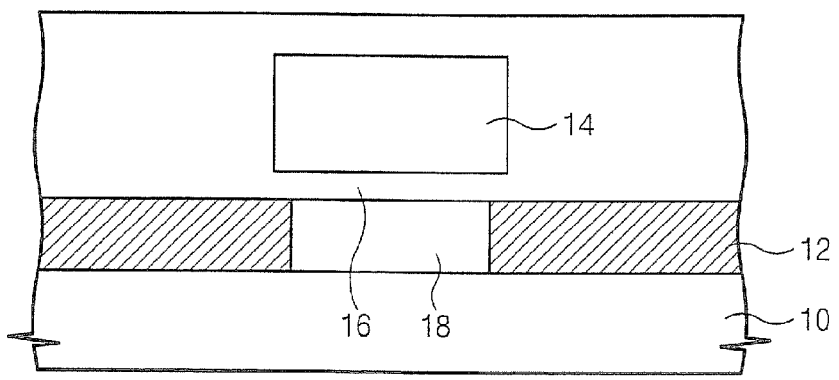
FIG. 1B is a cross-sectional view illustrating a conventional ultra-thin body transistor.
Figure 1C:
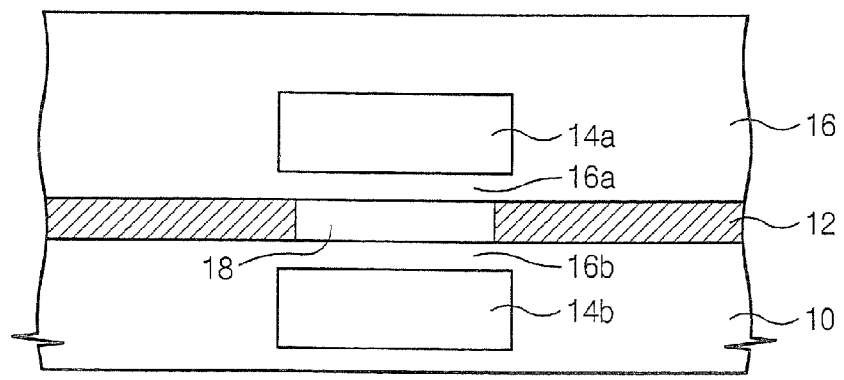
FIG. 1C is a cross-sectional view illustrating a conventional double-gate FET.
Figure 2A:
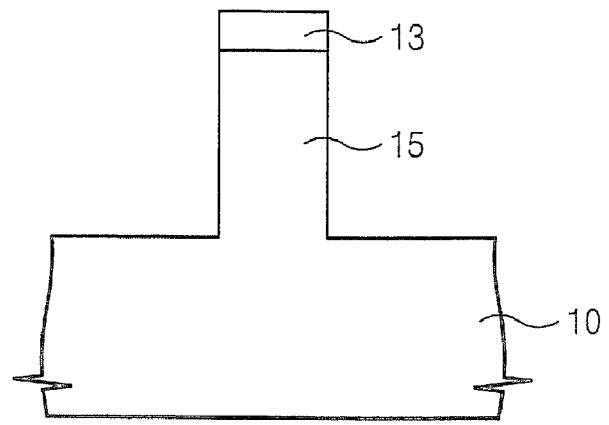
FIGS. 2A to 2D are cross-sectional views of a semiconductor substrate illustrating conventional methods of forming a conventional double-gate FinFET.
Figure 2B:
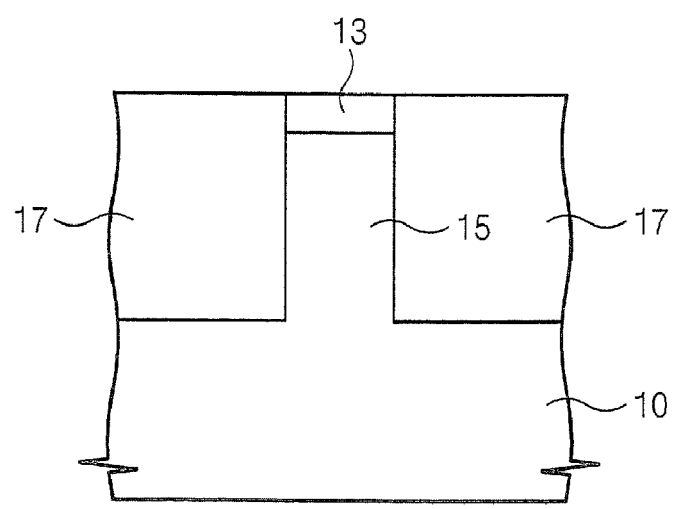
Figure 2C:
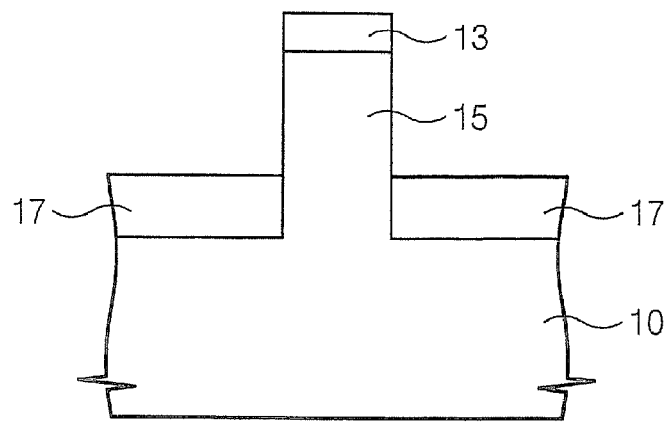
Figure 2D:
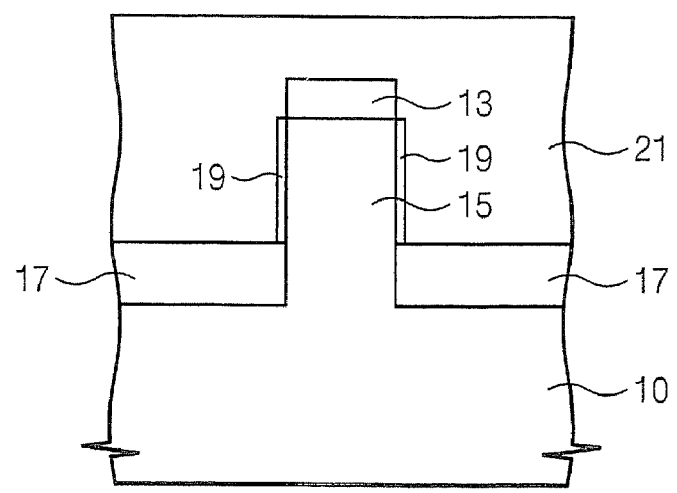
Figure 3A:
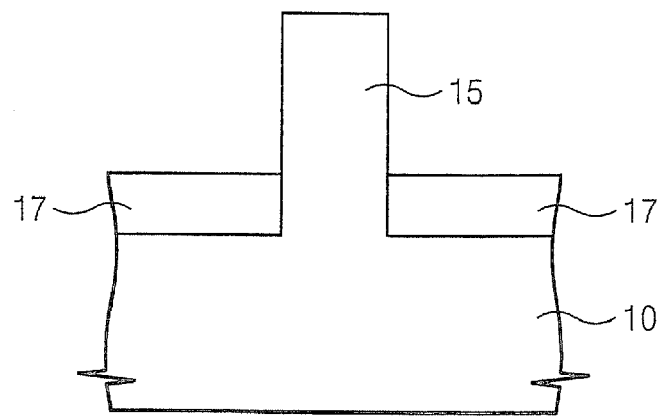
FIGS. 3A to 3B are cross-sectional views of a semiconductor substrate illustrating conventional methods of forming a conventional triple-gate FinFET.
Figure 3B:
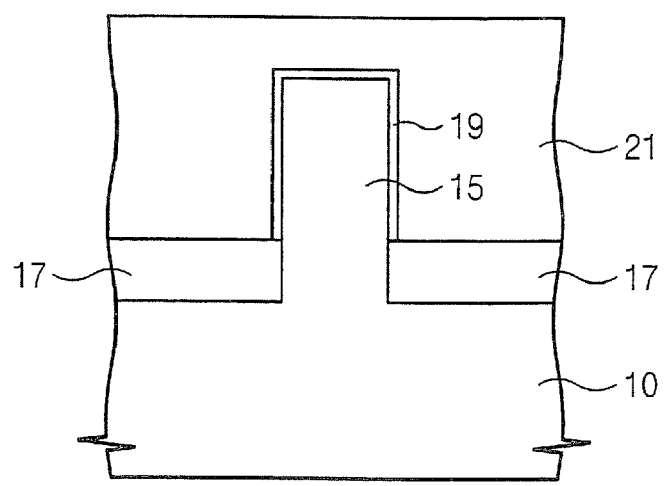

The present invention will be described more fully hereinafter with reference to the accompanying drawings, in which exemplary embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

Figure 4:
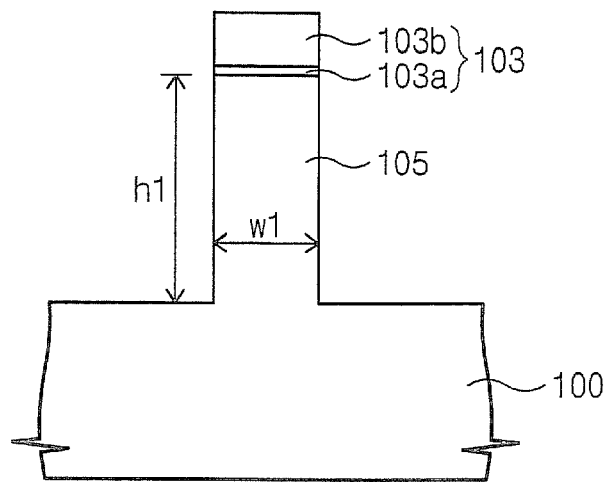
FIGS. 4 to 9 are cross-sectional views of a semiconductor substrate illustrating methods of forming a fin according to some embodiments of the present invention.

Methods for forming semiconductor fins according to some embodiments of the present invention will be described with reference to FIGS. 4 to 8. Referring now to FIG. 4, a semiconductor substrate 100 formed of silicon is prepared. The substrate may be selected from a variety of substrate configurations including, for example, wafers cut from Czochralski (CZ) or Float Zone (FZ) prepared single crystal bulk silicon substrates, and/or modified substrates including, for example, substrates incorporating one or more features such as epitaxial layers, buried insulating layers, and/or doped regions selected to provide desired structural and performance characteristics in the completed device.

Still referring to FIG. 4, an etch mask pattern 103 is formed on the semiconductor substrate 100. A region of the semiconductor substrate 100 protected by the etch mask pattern 103 may correspond to a transistor active region. The etch mask pattern 103 includes a buffer layer 103a, such as an oxide layer, formed directly on the semiconductor substrate 100, and a mask layer 103b, such as a nitride layer, formed on the buffer layer 103a. The etch mask pattern 103 may be formed by a conventional photolithography process and/or a patterning and etching process using dry and/or wet etching.

The region of the semiconductor 100 exposed by the etch mask pattern 103 is anisotropically etched to form a semiconductor fin 105 vertically protruding from the substrate 100 and having a first height "$h_1$" and a first width "$w_1$" under the etch mask pattern 103. The fin 105 may define a fin-shaped active region for the transistor. The first width "$w_1$" may be indicative of the length of a gate electrode to be formed on the fin 105. To achieve higher device integration, it may be preferable for the first width "$w_1$" of the fin 105 to be narrow. However, the first width "$w_1$" of the fin 105 may be determined by the width of the etch mask pattern 103, and as such, may be dependent on the photolithography process that is used.

Figure 5:
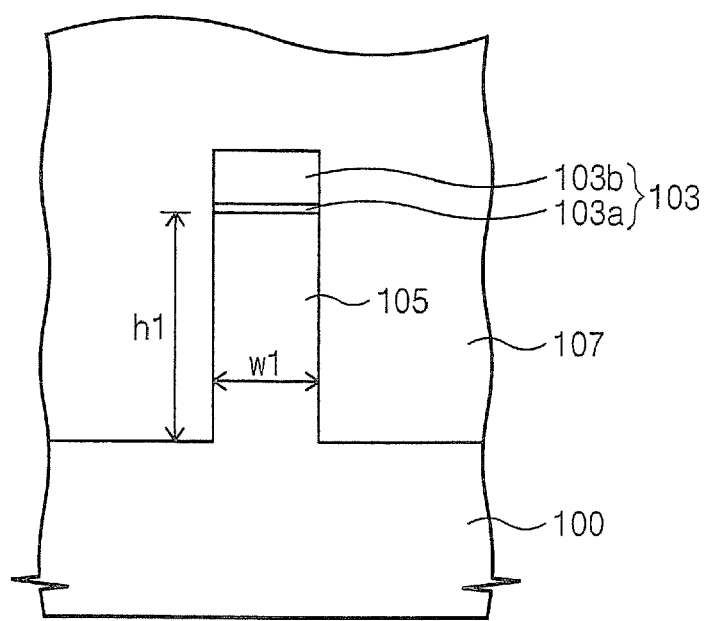

Now referring to FIG. 5, a device isolation layer 107 is formed on the fin 105 and the etch mask pattern 103. The device isolation layer 107 may be formed of an insulating layer, such as an oxide layer. Preferably, the device isolation layer 107 may be formed of an oxide layer having good gap filling characteristics.

Figure 6:
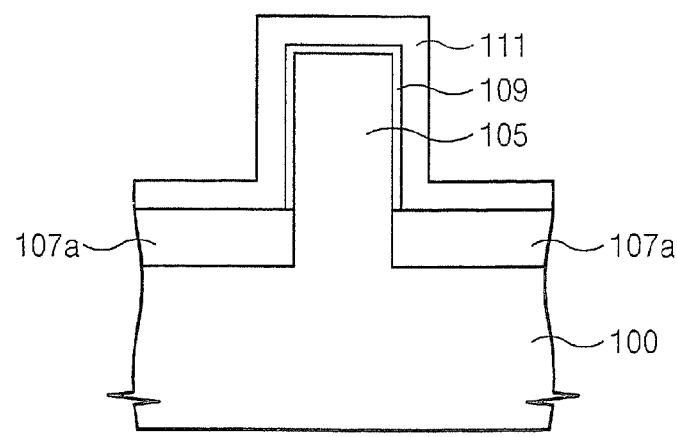

Referring now to FIG. 6, a portion of the device isolation layer 107 is removed to form a recessed device isolation layer 107a, thereby exposing opposing lateral surfaces or sidewalls of the fin 105. The etch mask pattern 103 is also removed to expose an upper surface of the fin 105. In particular, a portion of the device isolation layer 107 may be removed by sequentially performing a planarization process and an etch-back process. In other words, the device isolation layer 107 may be planarized until the etch mask pattern 103 is exposed. Then, the device isolation layer 107 may be etched back to expose opposing sidewalls of the fin 105. Alternatively, a portion of the device isolation layer 107 may be removed by performing only the etch-back process to expose the sidewalls of the fin 105. As a further alternative, a portion of the device isolation layer 107 can be removed after removing the etch mask pattern 103.

As a result, the sidewalls and the upper surface of the fin 105 are exposed by removing the portion of the device isolation layer 107 and the etch mask pattern 103.

Still referring to FIG. 6, an oxide layer 109 and an oxidation barrier layer 111 are sequentially formed on the exposed surfaces of the fin 105. The oxide layer 109 may be formed on the opposing sidewalls and the upper surface of the fin 105 by a thermal oxidation process. The oxidation barrier layer 111 is then formed on the oxide layer 109 and on the recessed device isolation layer 107a. The oxide barrier layer 111 may be formed of a material capable of preventing oxygen from penetrating into the fin 105, such as silicon nitride.

Alternatively, the oxide layer 109 may be formed by a vapor deposition method. In such a case, a vapor deposition oxide layer 109 may be formed on the recessed device isolation layer 107a as well as on the exposed sidewalls and upper surface of the fin 105.

Figure 7:
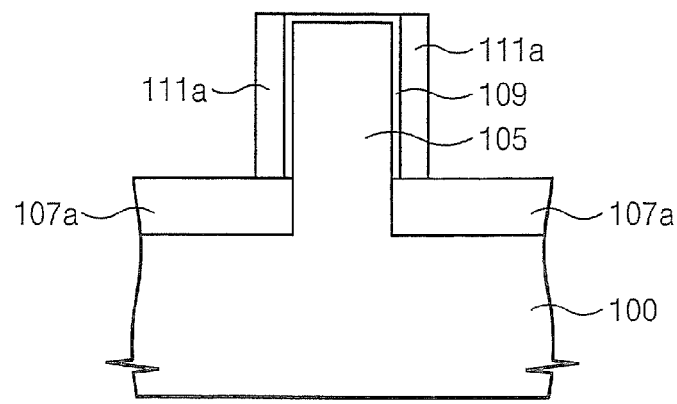

Referring now to FIG. 7, an etch-back process is performed with respect to the oxidation barrier layer 111, such that portions of the oxidation barrier layer 111 on the upper surface of the fin 105 and the recessed device isolation layer 107a are removed. As such, a fin structure is formed having an oxidation barrier layer 111a as a spacer on the oxide layer 109 at sidewalls of the fin 105. The oxidation barrier layer 111a may have a height no greater than about a height of the oxide layer 109. In other words, the oxidation barrier layer may have a height that is about the height of the fin 105.

Figure 8:
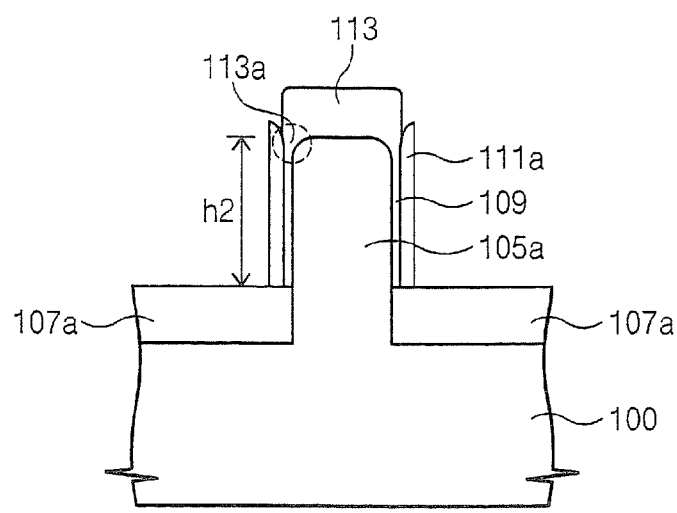

Referring to FIG. 8, a thermal oxidation process is performed on the fin structure. In particular, an upper surface of the fin 105 is oxidized to form a capping oxide layer 113. If the fin 105 is formed of silicon, the capping oxide layer 113 may be a silicon oxide layer. Alternatively, if the fin 105 is formed of silicon-germanium, the capping oxide layer 113 may be a silicon-germanium oxide layer. The oxidation barrier layer 111a remains at sidewalls of the fin 105 such that oxidation occurs only or predominantly at the upper surface of the fin 105, and such that little or no oxidation occurs at the sidewalls. In other words, the oxidation barrier layer 111a may have a height sufficient to reduce oxidation on the sidewalls of the fin 105 about halfway between the upper surface and the base of the fin 105. As a result, a fin 105a is formed. The fin 105a may have a second height "$h_2$" that is lower than the first height "$h_1$." In addition, a height of the oxidation barrier layer 111a is greater than that of the fin 105a, but is lower than that of the capping oxide layer 113.

In addition, the fin 105a has a curved sidewall portion at an upper edge 113a of the fin 105a, highlighted in FIG. 8 by a dotted circle. The curved portion may be formed due to an upper bird's beak that occurs at the upper edge 113a of the fin 105a. In other words, a bird's beak may be formed at the upper portion of the oxidation barrier layer 111a, allowing oxidation to occur at the upper edge 113a of the fin 105a. The oxidation may occur in a vertically downward direction from the upper surface of the fin 105. Since the oxidation barrier layer 111a protects both sidewalls of the fin 105, the oxidation occurs only or predominantly at the exposed upper surface of the fin 105, and the upper bird's beak is formed at the exposed upper edges 113a of the fin 105a as compared to other areas.

Figure 9:
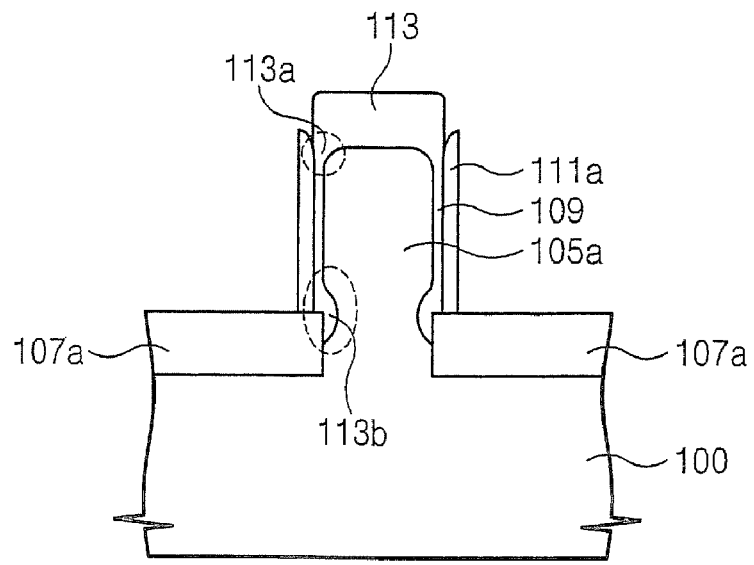

Moreover, a lower bird's beak may be formed at a base 113b of the fin 105 as shown in FIG. 9 by increasing the duration of the thermal oxidation process. Referring to FIG. 9, oxygen penetrates under the fin 105a along a lower portion of the oxidation barrier layer 111a during the thermal oxidation process such that a lower bird's beak is formed at the base 113b of the fin 105a. In other words, a junction between the oxidation barrier layer 111a and the recessed device isolation layer 107a facilitates diffusion of oxygen under the barrier layer 111a at the base 113b of the fin 105a to form the lower bird's beak. As described above, the oxidation barrier layer 111a remains as a spacer at sidewalls of the fin 105a, preventing oxidation at the sidewalls. As such, if the fin 105 has substantially vertical sidewalls, the fin 105a may have an "Ω" shape due to the upper and lower bird's beaks. In other words, oxidation occurs at the base of the fin 105 such that a width at the base of the fin 105a is relatively narrow as compared to upper portions of the fin 105a.

The lower bird's beak may be advantageous in that the fin 105a may have a good lateral profile. For example, if a relatively tall fin is formed by anisotropically etching the substrate, a lower width of the fin may be wider than an upper width of the fin. The lower bird's beak may reduce the lower width of the fin, so that the overall width of the fin may be uniform. In other words, both of the sidewalls of the fin may be substantially straight.

In the methods for forming a fin described above with reference to the embodiments of FIGS. 4 to 9, an additional thermal oxidation process and cleaning process may be performed prior to forming the oxide layer 109. As such, both the sidewalls and the upper surface of the fin 105 may be oxidized by the additional thermal oxidation process, and as a result, the width and height of the fin 105 may be further reduced. Accordingly, the width of the fin 105 may be reduced beyond that which may be achieved by conventional photolithography techniques, which may allow for higher device integration and improved device performance.

Also, with reference to the embodiments of FIGS. 4 to 9, a substrate with different physical, chemical and/or electrical characteristics as compared to bulk-silicon may be available. For example, silicon and/or silicon-germanium may be formed on a bulk-silicon substrate by an epitaxial growth method. Additionally, a silicon-on-insulator (SOI) substrate, where a semiconductor layer is formed on an insulating layer, can be used. If the semiconductor fin is formed on a SOI substrate, a device isolation layer may not be required. Accordingly, a fin may be formed by etching the silicon layer of the SOI substrate until the insulating layer is exposed.

In addition, with reference to the embodiments of FIGS. 4 to 9, the device isolation layer 107 may be formed after forming the oxidation barrier layer 111, which may make it easier to form an "Ω" shaped fin. FIGS. 10 to 13 illustrate additional methods of forming a fin according to some embodiments of the present invention.

Figure 10:
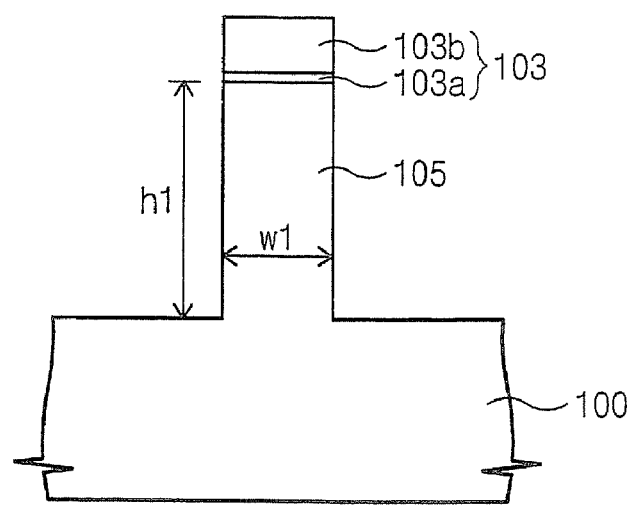
FIGS. 10 to 13 are cross-sectional views of a semiconductor substrate illustrating methods of forming a fin according to some embodiments of the present invention.

Referring now to FIG. 10, the semiconductor substrate 100 is etched using the etch mask pattern 103 to form the fin 105 as described above.

Figure 11:
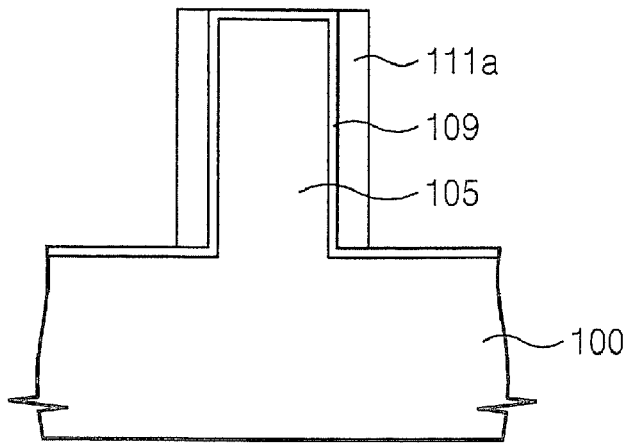

As shown in FIG. 11, the etch mask pattern 103 is removed, and an oxide layer 109 is formed on sidewalls and on an upper surface of the fin 105, as well as on the surface of the semiconductor substrate 100. An oxidation barrier layer 111 is formed on the oxide layer 109, and is then removed from the upper surface of the fin 105 and the substrate 100 by an anisotropic etching process. As a result, a fin structure having an oxidation barrier layer 111a as a spacer adjacent the oxide layer 109 on sidewalls of the fin 105 is formed.

Figure 12:
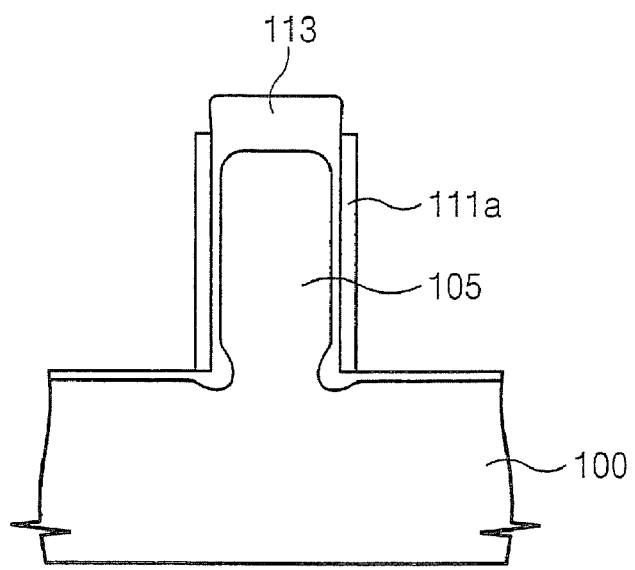

Referring to FIG. 12, a capping oxide layer 113 is formed on an upper surface of the fin 105 by performing a thermal oxidation process on the fin structure. As such, upper and lower bird's beaks may be formed at upper and lower edges of the fin 105. In contrast to the embodiments of FIG. 8, the fin structure is oxidized prior to the formation of a device isolation layer. Accordingly, a junction between the oxidation barrier layer 111a and the oxide layer 109 may facilitate the diffusion of oxygen at the base of the fin 105, which may allow the lower bird's beak to be formed more easily. As described above, the lower bird's beak may provide a good lower lateral profile for the fin 105.

Figure 13:
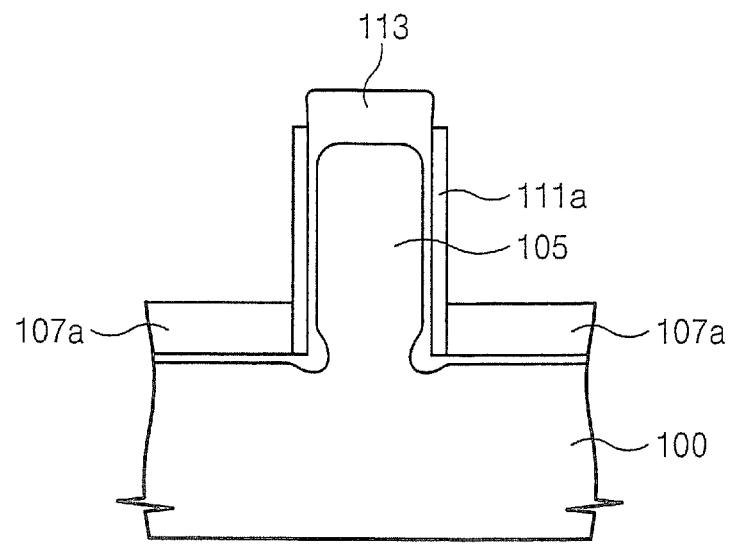

As shown in FIG. 13, a device isolation layer is formed, and an etch-back process is performed to form a recessed device isolation layer 107a. In order to protect the capping oxide layer 113 during the etch-back process, a protective layer, such as a nitride layer, may be formed on the capping oxide layer 113 before forming the device isolation layer. If a protective layer is used, the device isolation layer 107a may also be formed using a planarization process followed by an etch-back process. An additional thermal oxidation process and a cleaning process may also be performed to reduce the width of the fin 105. In particular, after forming the fin 105, the additional thermal oxidation process is used to form an oxide layer on the upper surface and sidewalls of the fin 105. The oxide layer is then removed using the cleaning process, thereby reducing the width of the fin 105.

Figure 14:
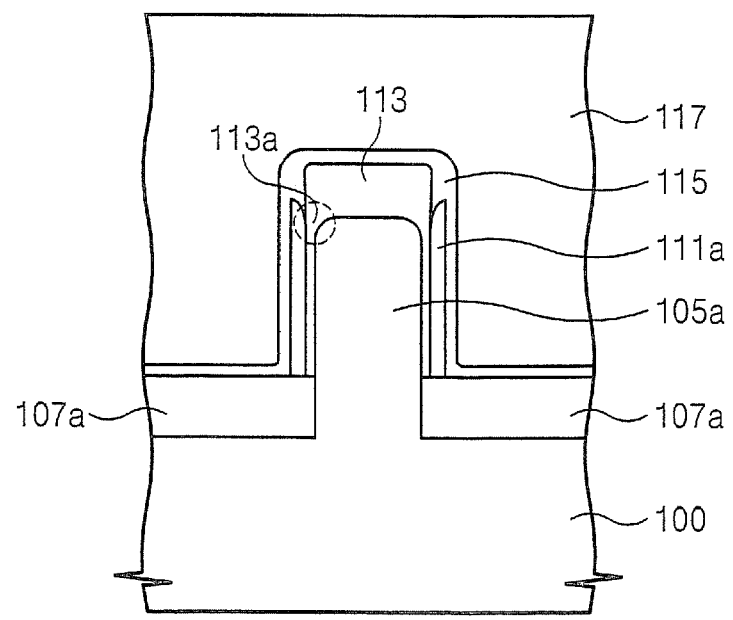
FIG. 14 is a cross-sectional view illustrating method for forming a SONOS memory device according to some embodiments of the present invention.

A method for forming a non-volatile memory device will now be described with reference to FIG. 14. Referring now to FIG. 14, after forming the fin 105a and the capping layer 113 as described above with reference to the embodiments of FIGS. 8, 9 and/or 13, a blocking insulating layer 115 is formed on the oxidation barrier layer 111a, the capping layer 113, and the device isolation layer 107a. The blocking insulating layer 115 may be formed of an oxide layer, or, more specifically, an oxide-nitride-oxide layer. Gate electrode material is then deposited on the blocking insulating layer 115 and is patterned to form a gate electrode 117. Impurity ions are then implanted into the fin 105a at both sides of the gate electrode 117 to form impurity diffusion regions, i.e. source/drain regions. In the device of FIG. 14, when a positive voltage is supplied by the gate electrode 117, electrons may tunnel from the sidewalls of the fin 105 through the oxide layer 109 and into the oxidation barrier layer 111a, where the electrons may be trapped. Likewise, electrons may be expelled from the oxidation barrier layer 111a into the fin 105 when a negative voltage is supplied by the gate electrode 117.

Figure 15:
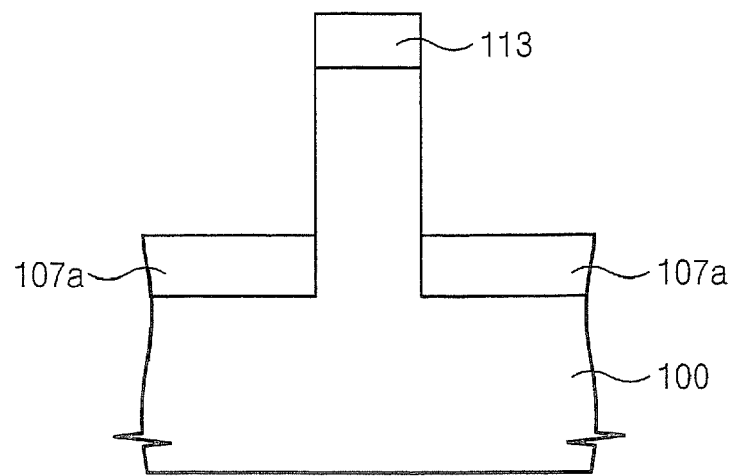
FIGS. 15 and 16 are cross-sectional views illustrating methods for forming a flash memory device according to some embodiments of the present invention.
Figure 16:
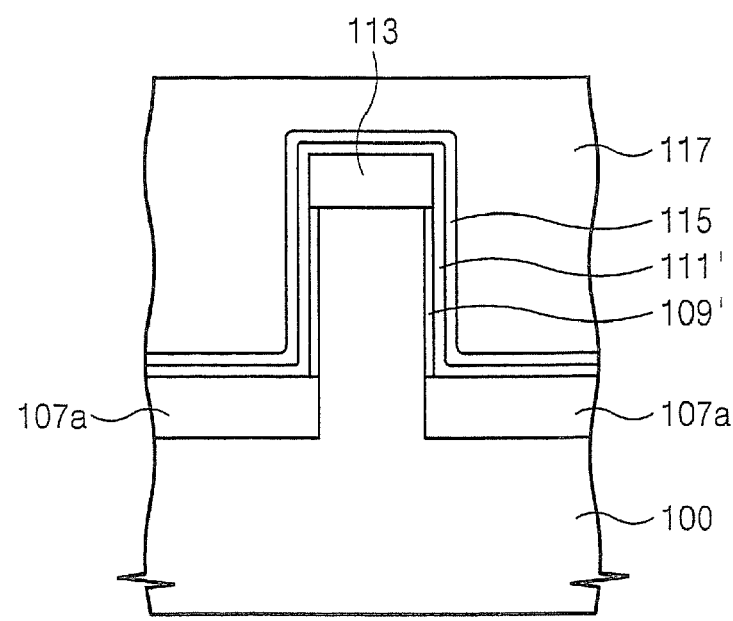

In the above method for forming a non-volatile memory device, the oxidation barrier layer 111a and the oxide layer 109 may be removed before forming the blocking insulating layer 115. FIGS. 15 and 16 illustrate methods for forming such a non-volatile memory device. Referring now to FIG. 15, after forming the fin 105 and the capping layer 113 as described above with reference to the embodiments of FIGS. 8, 9 and/or 13, the oxidation barrier layer 111a and the oxide layer 109 are removed to expose sidewalls of the fin 105.

Next, referring to FIG. 16, a tunneling insulating layer 109' is formed on the exposed sidewalls of the fin 105, and a charge storage layer 111' and a blocking insulating layer 115 are formed on the fin 105. Gate electrode material is then formed on the blocking insulating layer 115 and is patterned to form a gate electrode 117. The tunneling insulating layer 109' and the blocking insulating layer 115 may be formed of an oxide layer. More particularly, the blocking insulating layer 115 may be formed of a multi-layered structure, such as a sequentially stacked oxide-nitride-oxide layer or a nitride-oxide-nitride layer.

Still referring to FIG. 16, the charge storage layer 111' may be formed of silicon nitride, polysilicon, amorphous silicon, nano-crystal, or quantum dot materials. For instance, when a conductive layer such as polysilicon is used as the charge storage layer 111', a floating-gate type flash memory device may be formed. It may be preferable for the charge storage layer 111' to remain only on sidewalls of the fin 105, for example, by performing an etch-back process.

Methods for forming FinFETs according to some embodiments of the present invention will now be described with reference to FIGS. 17 and 18.

Figure 17:
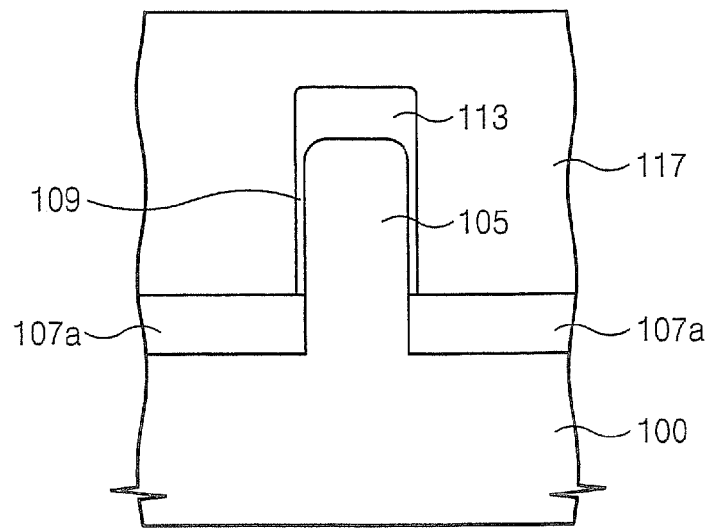
FIG. 17 is a cross-sectional view illustrating methods for forming a double-gate transistor according to some embodiments of the present invention.

FIG. 17 is a cross-sectional view of a semiconductor substrate illustrating methods for forming a double-gate FinFET according to some embodiments of the present invention.

Referring to FIG. 17, after forming a fin 105 and a capping layer 113 as described above with reference to the embodiments of FIGS. 8, 9 and/or 13, the oxidation barrier layer 111a is removed. Gate electrode material is then formed on the fin 105 and the capping layer 113, and the gate electrode material is patterned to form a gate electrode 117. An ion implantation process is then performed to form impurity diffusion regions (i.e. source/drain regions) in the fin 105 at both sides of the gate electrode 117. The oxide layer 109 may also be removed after removing the oxidation barrier layer 111a. In such a case, a gate insulating layer may be formed on sidewalls of the fin 105 by a thermal oxidation process prior to forming the gate electrode 117.

Figure 18:
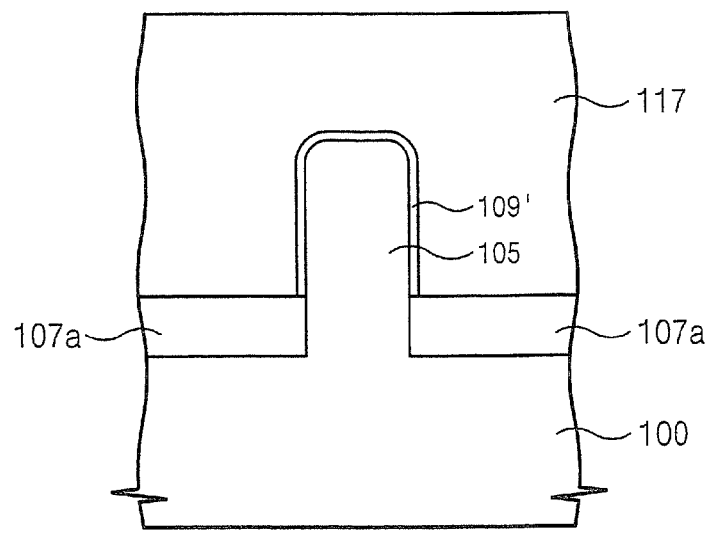
FIG. 18 is a cross-sectional view illustrating methods for forming a triple-gate transistor according to some embodiments of the present invention.

FIG. 18 illustrates methods for forming triple-gate FinFETs according to some embodiments of the present invention. Referring to FIG. 18, after forming the fin 105 and the capping layer 113 as described above with reference to the embodiments of FIGS. 8, 9 and/or 13, the oxidation barrier layer 111a, the oxide layer 109 and the capping layer 113 are removed. A gate insulating layer 109' is then formed on the exposed sidewalls and the upper surface of the fin 105. Gate electrode material is then deposited on the fin 105 and patterned to form a gate electrode 117. After forming the gate electrode 117, impurity ions are implanted into the fin 105 at both sides of the gate electrode 117 to form impurity diffusion regions (i.e. source/drain regions).

Figure 19A:
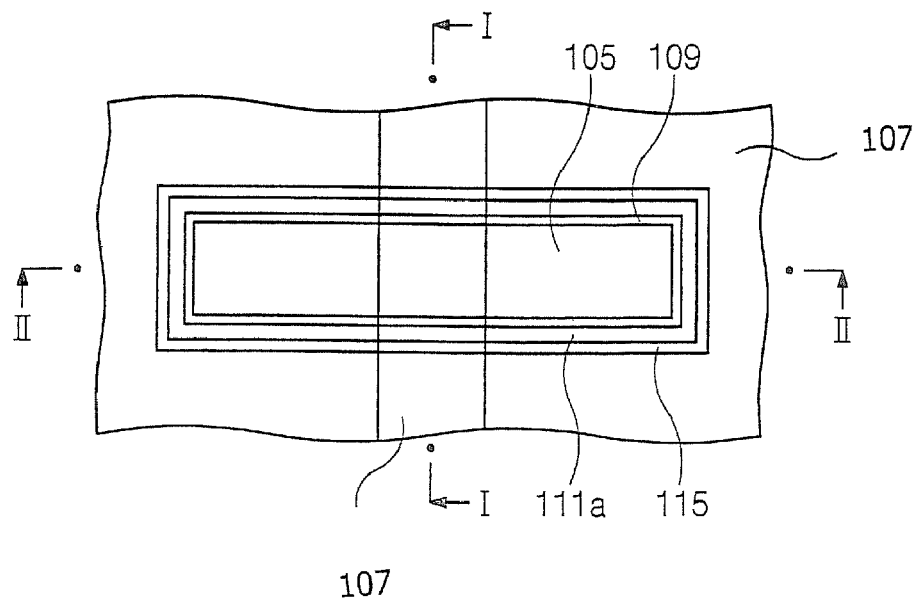
FIGS. 19A to 19C are cross-sectional views illustrating a non-volatile memory device according to some embodiments of the present invention.
Figure 19B:
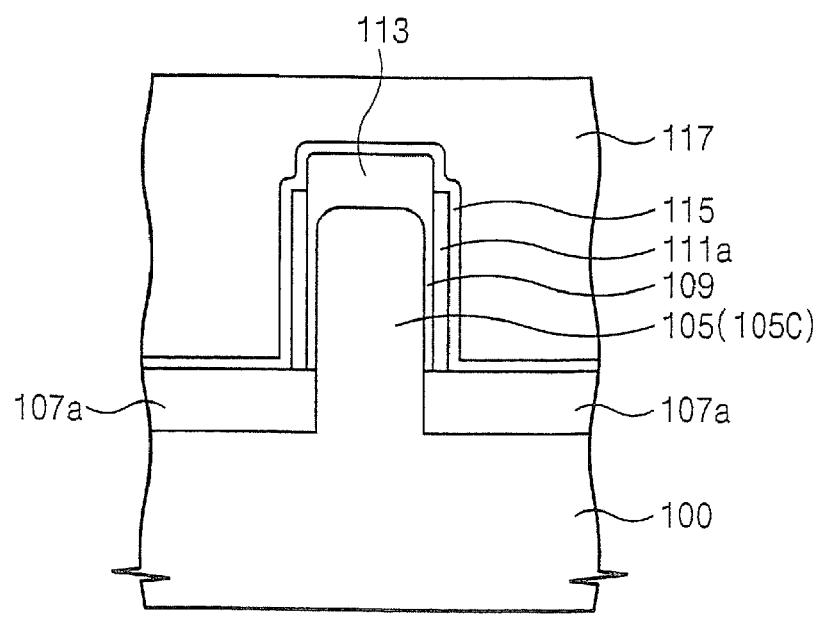
Figure 19C:
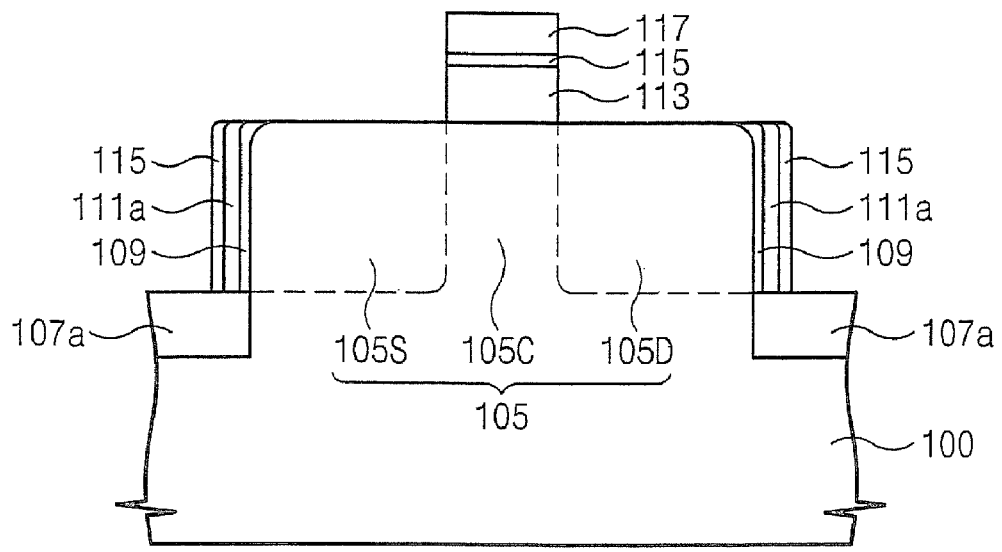

FIGS. 19A to 19C illustrate non-volatile memory devices according to some embodiments of the present invention. FIGS. 19B and 19C are cross-sectional views taken along line I-I and II-II of FIG. 19A.

Referring now to FIGS. 19A to 19C, a non-volatile memory device includes a fin 105 having a capping oxide layer 113. An upper edge of the fin 105 has at least one curved sidewall portion. The capping oxide layer 113 and portions of a blocking insulating layer 115 and a gate electrode 117 are sequentially stacked on an upper surface of the fin 105. In addition, an oxide layer 109, an oxidation barrier layer 111a (or a charge storage layer), and portions of the blocking insulating layer 115 and the gate electrode 117 are sequentially stacked on sidewalls of the fin 105. As shown in FIG. 19C, the fin 105 includes a channel region 105C, a source region 105S, and a drain region 105D.

In the embodiments of FIGS. 19A to 19C, the blocking insulating layer 115 and the oxidation barrier layer 111a may be removed prior to forming the gate electrode 117 to form a FinFET.

Methods for forming a fin using a dummy gate pattern will now be described with reference to FIGS. 20A to 23A, 20B to 23B, and 20C to 23C. FIGS. 20A to 23A are overhead views of a semiconductor substrate. FIGS. 20B to 23B, and 20C to 23C are cross-sectional views taken along lines I-I and II-II of FIG. 19A, respectively.

Figure 20A:
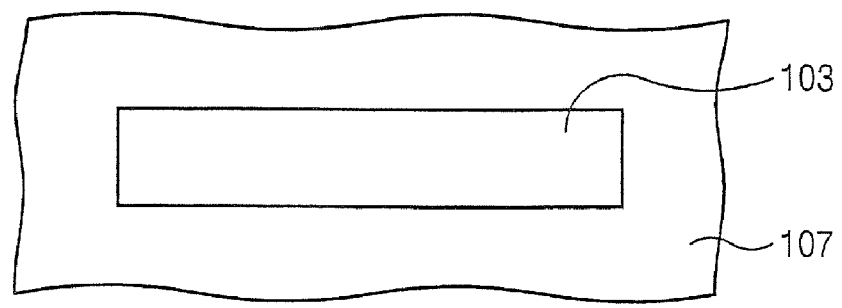
Figure 20B:
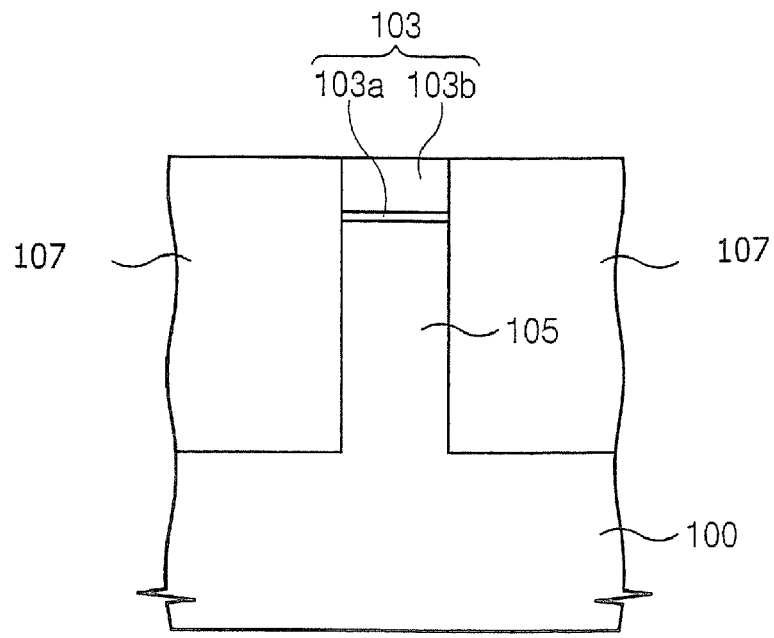
Figure 20C:
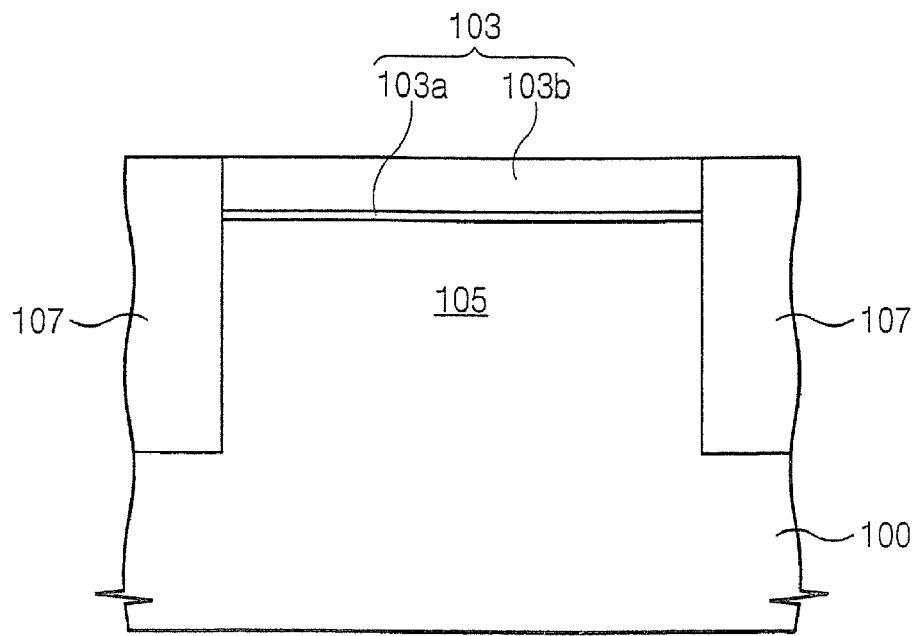

Referring to FIGS. 20A to 20C, after forming an etch mask pattern 103 on a semiconductor substrate 100, an exposed portion of the substrate 100 is etched to form a fin 105. Then, an insulating layer is formed on the substrate 100, and a planarization process is performed to form a device isolation layer 107 surrounding the fin 105. The etch mask pattern 103 may be used as a stop layer in the planarization process.

Figure 21A:
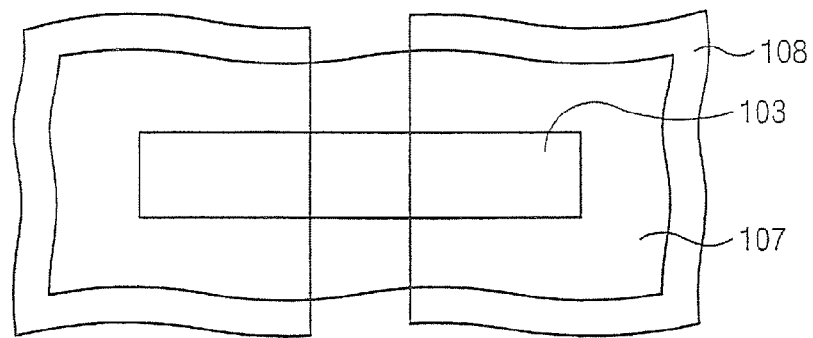
Figure 21B:
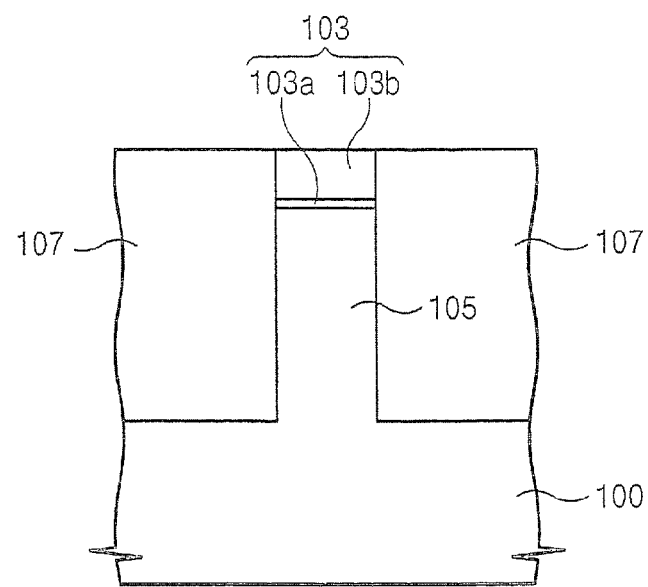
Figure 21C:
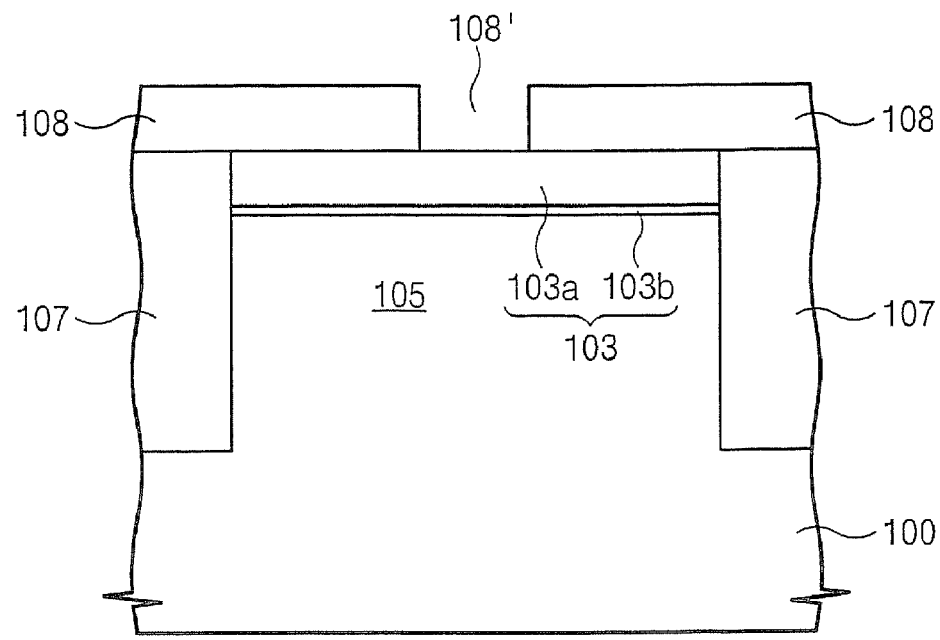

Next, as shown in FIGS. 21A to 21C, a dummy gate pattern 108 is formed on a portion of the device isolation layer 107 and the etch mask pattern 103. The dummy gate pattern 108 includes a groove 108', which may be used to define a gate electrode in a subsequent step. The dummy gate pattern 108 may be formed of a material having an etch selectivity with respect to an upper layer 103b of the etch mask pattern 103. For example, the dummy gate pattern 108 may be formed of an oxide layer. As such, the groove 108' may be formed by selectively etching the dummy gate pattern 108.

Figure 22A:
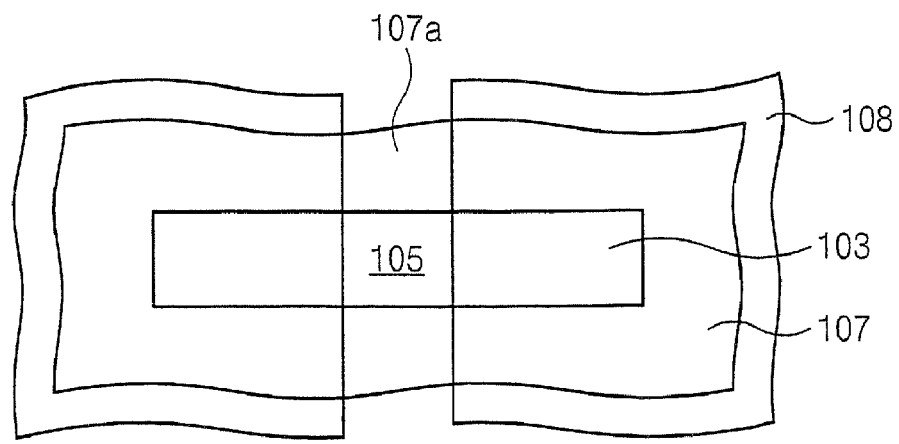
Figure 22B:
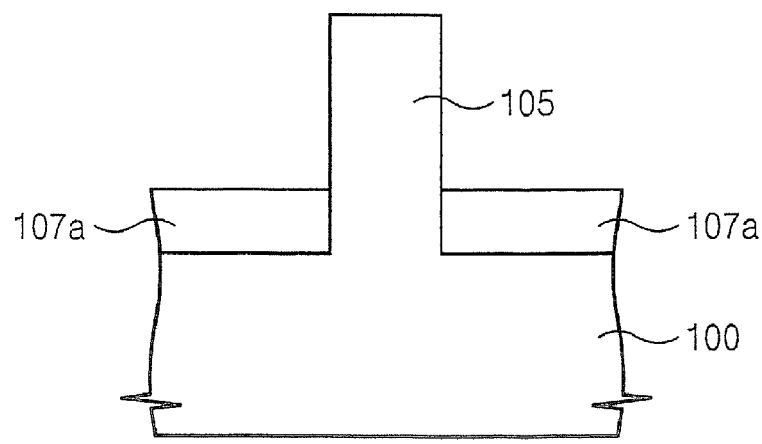
Figure 22C:
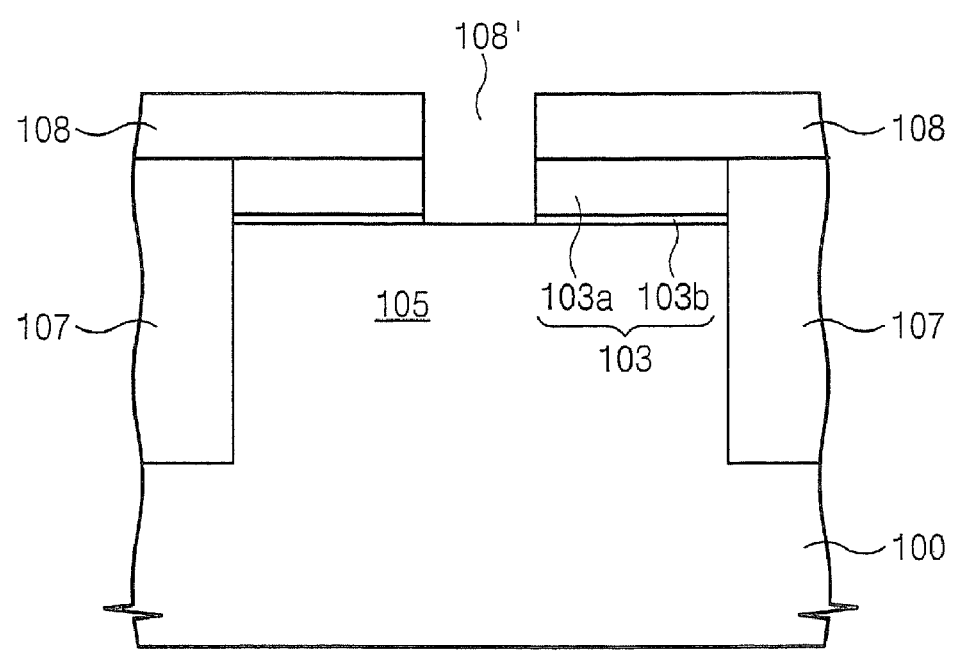

Referring now to FIGS. 22A to 22C, a portion of the etch mask pattern 103 exposed by the dummy gate pattern 108 is removed to expose an upper surface of the fin 105, and the device isolation layer 107 is etched to form a recessed device isolation layer 107a, exposing sidewalls of the fin 105.

Figure 23A:
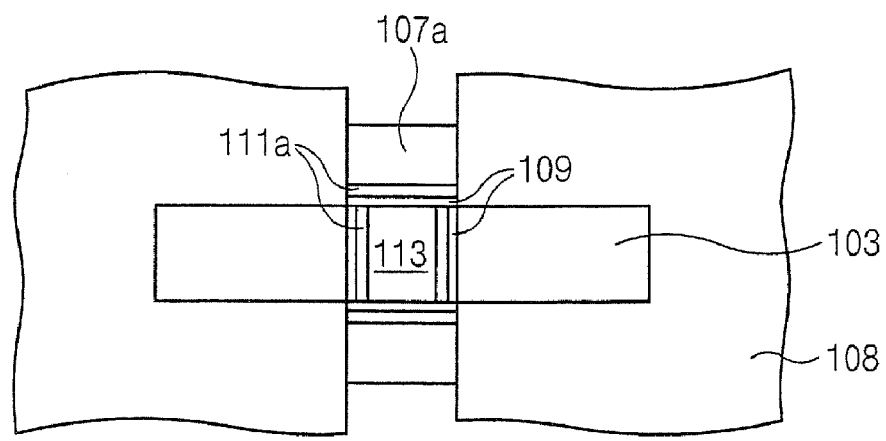
Figure 23B:
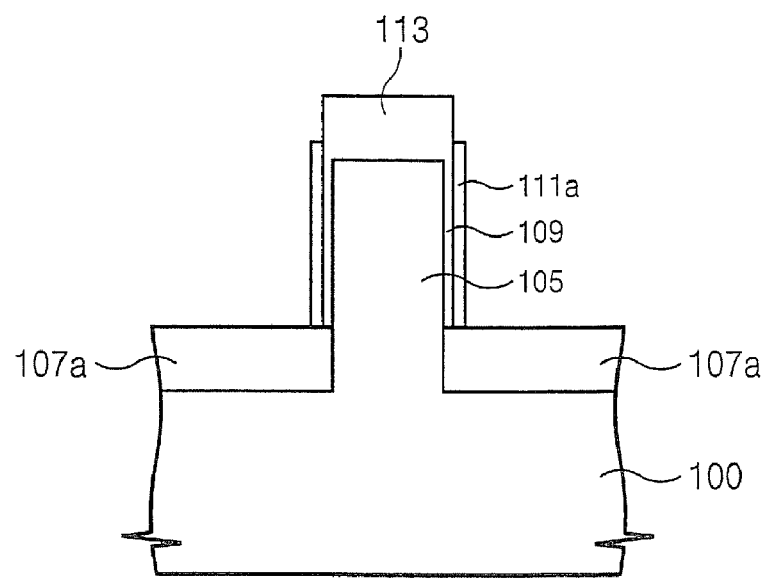
Figure 23C:
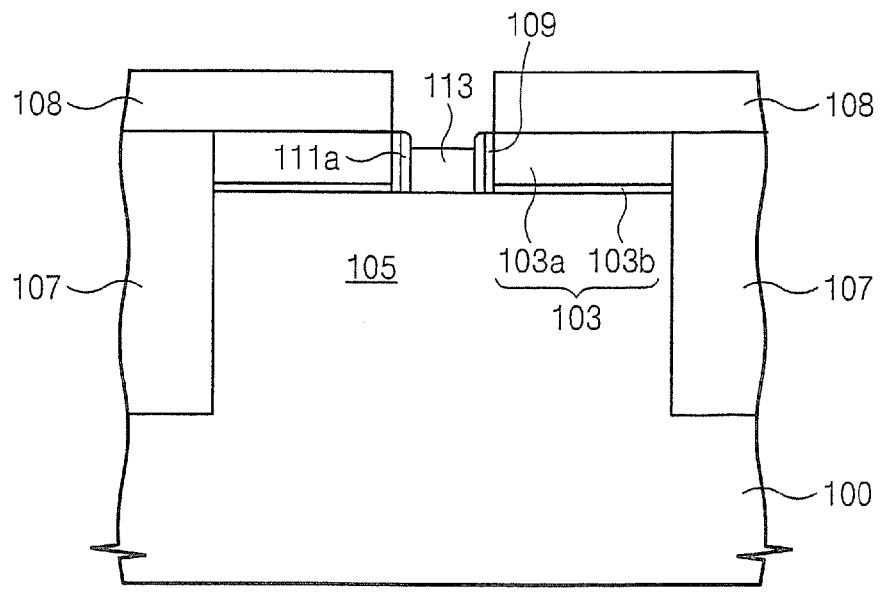

Next, as shown in FIGS. 23A to 23C, an oxide layer 109 is formed on the exposed sidewalls and the exposed upper surface of the fin 105. An oxidation barrier layer is then formed on the oxide layer 109, and an etch-back process is performed to form an oxidation barrier layer 111a on the oxide layer 109 on sidewalls of the fin 105. A thermal oxidation process is then performed to form a capping layer 113 on an upper surface of the fin 105. As a result of the thermal oxidation, at least one curved sidewall portion may be formed proximate the upper surface of the fin 105.

After forming the fin 105 as described with reference to FIGS. 20A to 23C, a semiconductor device, such as a non-volatile memory device and/or a FinFET, may be fabricated as described above with reference to the embodiments of FIGS. 15, 16, 17 and/or 18.

Figure 24A:
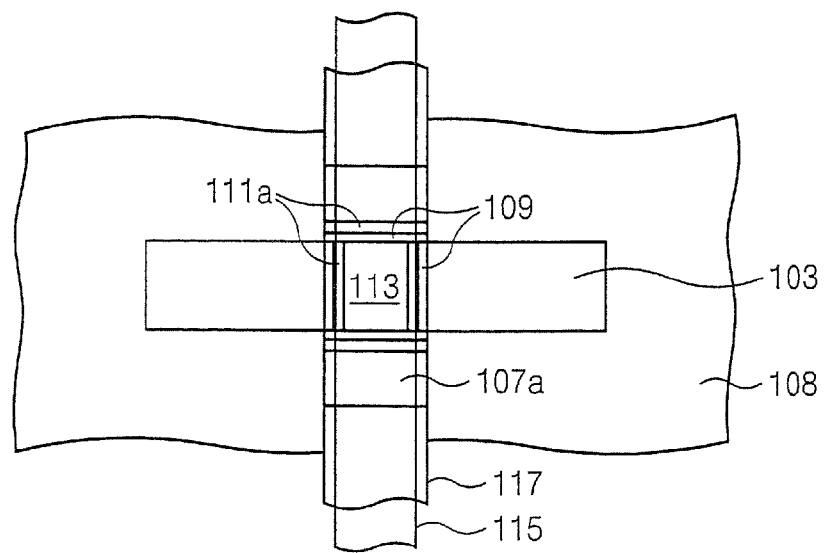
FIGS. 24A to 24C are overhead and cross-sectional views methods for forming a SONOS memory device according to some embodiments of the present invention.
Figure 24B:
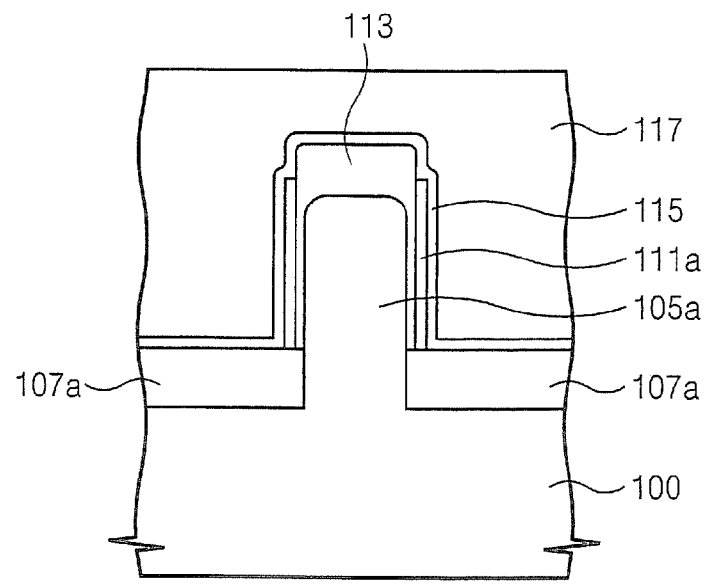
Figure 24C:
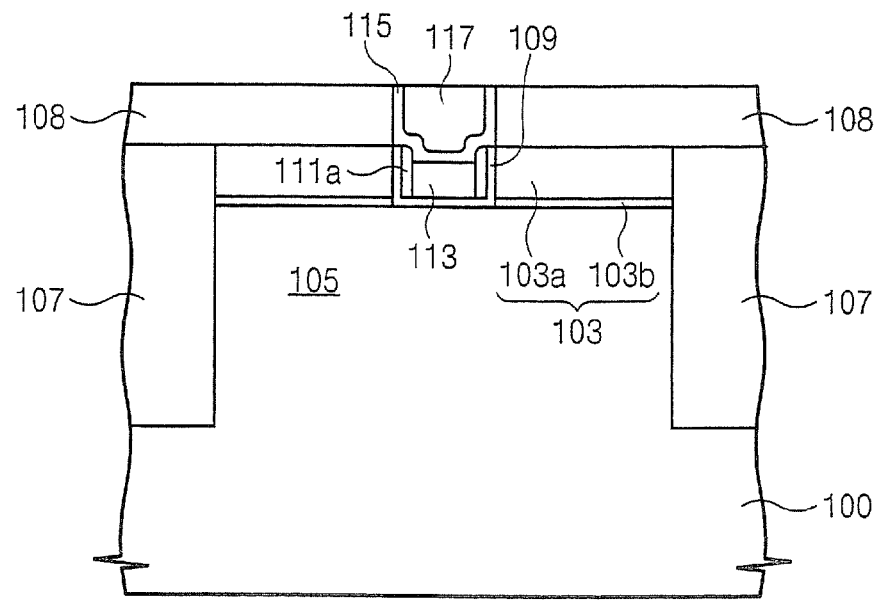

Methods for forming a SONOS non-volatile memory device will now be described with reference to FIGS. 24A to 24C. Referring to FIGS. 24A to 24C, after forming the capping oxide layer 113 on the fin 105 as described above, a blocking insulating layer 115 is formed on the fin 105, and gate electrode material is formed on the blocking insulating layer 115. A planarization process is then performed until the dummy gate pattern 108 is exposed to form a gate electrode 117.

Alternatively, if a floating-gate flash device is to be formed, the oxidation barrier layer 111a may be removed, a charge storage layer may be formed, and then the blocking insulating layer 115 may be formed.

As a further alternative, if a FinFET is to be formed, the oxidation barrier layer 111a may be removed, gate electrode material may be deposited, and a planarization process may be performed to form the gate electrode 117.

As described above, a fin structure may include a fin formed on a semiconductor substrate having opposing sidewalls that are protected by an oxidation barrier layer. As such, when the fin structure is exposed to thermal oxidation, a capping oxide layer formed of an oxide layer during a thermal oxidation process may be formed only on an upper surface of the fin. In addition, a bird's beak may be formed along upper portions of the fin during the thermal oxidation process. Accordingly, an upper edge of the fin may have a curved profile. In other words, at least one curved sidewall portion may be formed proximate the upper surface of the fin due diffusion of oxygen at the upper portion of the oxidation barrier layer during the thermal oxidation process. Also, a second curved sidewall portion may be formed proximate a base of the fin, due to diffusion of oxygen at a junction between the lower portion of the oxidation barrier layer and the substrate during the thermal oxidation process. For instance, the silicon fin may be $\Omega$-shaped. A FinFET having an $\Omega$-shaped fin may have improved channel control characteristics as compared with a FinFET having substantially vertical sidewalls.

Moreover, the capping oxide layer may be formed of a composite material, such as a four-group oxide structure. As such, the capping oxide layer may have a lower dielectric constant as compared to an etch mask capping layer formed of a conventional nitride layer. Accordingly, the thickness of the capping oxide layer may be reduced, thereby reducing the overall height of the fin and the capping layer.

Furthermore, according to some embodiments of the present invention, FinFETs and non-volatile memory devices with reduced subthreshold "hump" characteristics may be formed.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A semiconductor device, comprising:
   a fin-shaped active region vertically protruding from a semiconductor substrate, the fin-shaped active region having at least one curved sidewall portion proximate an upper surface of the fin-shaped active region;
   an oxide layer on opposing sidewalls of the fin-shaped active region;
   a capping oxide layer on the upper surface of the fin-shaped active region, the capping oxide layer being thicker than the oxide layer; and
   an oxidation barrier layer extending along opposing sidewalls of the fin-shaped active region, wherein the oxidation barrier layer has a curved upper portion proximate the upper surface of the fin-shaped active region, wherein the curved upper portion faces the opposing sidewalls of the fin-shaped active region and facilitates oxidation at the upper surface of the fin-shaped active region.

2. The device of claim 1, wherein the oxidation barrier layer has a height sufficient to reduce oxidation on the sidewalls of the fin-shaped active region about halfway between the upper surface and a base of the fin-shaped active region.

3. The device of claim 1, wherein the fin-shaped active region has a second curved sidewall portion proximate the base of the fin-shaped active region that is spaced apart from the at least one curved sidewall portion proximate the upper surface of the fin-shaped active region such that a width of the base of the fin-shaped active region is narrower than a width at upper portions of the fin-shaped active region.

4. The device of claim 1, further comprising:
   a gate electrode formed on the oxide layer and on the capping layer.

5. The device of claim 1, further comprising:
   a charge storage layer on the oxide layer on the sidewalls of the fin-shaped active region;
   a blocking insulating layer on the charge storage layer and on the capping oxide layer; and
   a gate electrode on the blocking insulating layer.

6. The device of claim 5, wherein the charge storage layer comprises silicon nitride, polysilicon, amorphous silicon, nano-crystal, and/or quantum dot materials.

7. The device of claim 1, further comprising:
   an oxidation barrier spacer on the oxide layer formed on the sidewalls of the fin-shaped active region;
   a blocking insulating layer on the oxidation barrier spacer and on the capping oxide layer; and
   a gate electrode on the blocking insulating layer,
   wherein the oxidation barrier spacer comprises silicon nitride.

8. The device of claim 1, wherein the capping oxide layer has a dielectric constant lower than a nitride mask pattern.

* * * * *